United States Patent
Li et al.

(10) Patent No.: US 7,116,261 B1
(45) Date of Patent: Oct. 3, 2006

(54) METHOD AND APPARATUS FOR ACCURATE INVERSE-LINEAR VOLTAGE/CURRENT GENERATOR

(75) Inventors: Xiaopeng Li, Frisco, TX (US); Haydar Bilhan, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/124,675

(22) Filed: May 9, 2005

(51) Int. Cl.
*H03M 1/12* (2006.01)
(52) U.S. Cl. ...................................... 341/155
(58) Field of Classification Search ................. 341/76, 341/77, 139, 143, 155, 144, 145
See application file for complete search history.

(56) References Cited

U.S. PATENT DOCUMENTS

| | | | | |
|---|---|---|---|---|
| 5,831,473 A | * | 11/1998 | Ishii | 327/530 |
| 6,567,025 B1 | * | 5/2003 | Schreier et al. | 341/143 |
| 6,724,333 B1 | * | 4/2004 | Noro et al. | 341/144 |
| 6,778,126 B1 | * | 8/2004 | Ali | 341/156 |

* cited by examiner

*Primary Examiner*—Brian Young
(74) *Attorney, Agent, or Firm*—Carlton H. Hoel; W. James Brady; Frederick J. Telecky, Jr.

(57) ABSTRACT

To make use of its full input voltage operating range, an analog-to-digital converter is configured with a switched-capacitor circuit to produce a digital output signal from an analog input signal that lies within a range of input signal voltage. The analog-to-digital converter is configured with an amplifier with a digitally programmable gain and a voltage generator with a digitally controlled output voltage. The voltage generator is coupled through a buffer to the amplifier input and generates an output voltage inversely proportional to the amplifier gain. The amplifier gain and the voltage generator output voltage are controllable with the same digital control signal. The combination of the amplifier and the voltage generator can be configured to produce a voltage for the analog-to-digital converter that lies in a prescribed voltage range, avoiding the need to generate substantial current from the voltage generator for a switched-capacitor circuit.

15 Claims, 4 Drawing Sheets

METHOD AND APPARATUS FOR ACCURATE INVERSE-LINEAR VOLTAGE/CURRENT GENERATOR

TECHNICAL FIELD

This invention relates generally to hardware implementations of analog-to-digital converters, and, in particular, it relates to a method and implementation of an analog-to-digital converter configured with switched-capacitor circuit technology.

BACKGROUND

As the designs of electronic systems such as communication, recording, and entertainment systems migrate toward greater utilization of digital circuits, the precise and rapid conversion of analog signals into a digital format has become an essential design element. For example, to preserve the visual quality of an incoming high-definition analog video signal, an integrated circuit to convert the signal into a digital format typically requires 10 bits of precision in the analog-to-digital converter (ADC), with 6 MHz of bandwidth.

ADCs are usually designed to operate with a fixed range of input voltages, such as −0.5 volt to 0.5 volt, and are generally designed using switched-capacitor circuit technology to preserve the analog-to-digital conversion accuracy. Switched-capacitor circuit technology is a preferred circuit approach in view of the substantial variations in practical semiconductor manufacturing processes which produce resistors, capacitors, and transistors in integrated circuits with very accurate areas for the circuit elements, but with substantial variations from lot to lot in device parameters, such as resistance or capacitance, the variations sometimes approaching or even exceeding 30%. For example, individual capacitors formed on a die may exhibit substantial capacitance variations from a nominal design value due to imprecise control of dielectric thickness, but all capacitors on the die will be formed with substantially identical areas, which is well controlled by a precise lithographic process. All the capacitors on the die will, nonetheless, have substantially the same dielectric thickness, resulting in all capacitors having essentially the same capacitance deviation. Thus, a capacitance ratio on a die is a precisely controlled variable, not the absolute capacitances. Resistances and certain transistor parameters show similar substantial variations depending on manufacturing process parameters and device operating temperature, but resistance ratios for similar elements on the same die can also be accurately maintained. Since the accuracy of an analog-to-digital conversion or an amplification gain using switched-capacitor technology depends primarily on ratios of capacitances and resistances, this technology, which is readily amenable to implementation with fine-line feature sizes and which readily accommodates mixed-signal implementations, has become the design approach of choice for high speed, high accuracy, integrated circuits.

A practical high-performance analog-to-digital conversion process typically provides conversion for an input voltage signal that is limited to a voltage range from zero volts to some upper, variable voltage limit. The upper voltage limit may vary, for example, between 0.5 volts and 2.0 volts. To preserve the accuracy of the analog-to-digital conversion process, the input voltage signal must first be adjusted with accurate gain and offset so that it falls within the operating voltage limits of the ADC, such as −0.5 to 0.5 volt.

FIG. 1 illustrates a block diagram of the prior art showing scaling and shifting of an analog voltage input signal so that it falls within a fixed voltage range of an ADC such as −0.5 to 0.5 volt. The clamp 102 is included in the circuit to prevent the input voltage signal from assuming negative values. The buffer 104 is typically configured with two source followers so that the circuit does not load the input signal source, and provides a balanced, two-rail output for high-frequency performance of the downstream portions of the circuit. The amplifier 106 is a switched-capacitor programmable-gain amplifier (PGA) with its gain controlled typically by a four-bit digital gain-code signal. The required gain of the PGA is controlled to vary as $1/V_{max}$ in the present example, where $V_{max}$ is the upper voltage limit of the input voltage signal. A constant offset voltage, $V_{OFFSET}$, shifts the output voltage of the PGA using a voltage summing process such as the summers 108 so that the signal presented to the analog-to-digital converter 110 falls symmetrically within the range of −0.5 to 0.5 volt, thereby making full use of the input operating voltage range of the ADC. The process of scaling and shifting of the input voltage signal preserves the data accuracy in the output signal 112 from the ADC for the number of bits provided for the conversion process. If the input signal is not scaled and shifted to make use of the full operating range of the ADC, the analog-to-digital conversion process would operate with a reduced effective number of bits in the conversion process, i.e., it would "waste" one or two bits of precision.

However, when using switched-capacitor circuit technology, substantial drive currents are required to couple certain circuit elements, such as to a voltage source producing an offset voltage, due to the charge transfer nature of switched-capacitor circuits. For example, a switched-capacitor circuit with a switching frequency of 165 MHz implemented in an integrated circuit with 0.13 μm feature size may require source currents that can exceed 10 mA to produce an offset voltage. Large drive currents from such a source raise difficult practicality and cost issues that must be assessed in view of common design objectives for generally reducing energy consumption for any electronic equipment, and particularly for extending battery life for portable equipment.

To obtain high accuracy using switched-capacitor circuit technology, with its capability for implementation with fine-line integrated circuit technology and its immunity to manufacturing process variations, the prior art uses a circuit arrangement for analog-to-digital conversion that voltage-shifts an input voltage using a high drive current. The high drive current substantially increases the power required by the circuit, which detracts from product acceptance, particularly for portable systems and systems that operate continuously.

Thus, what is needed in the art is a circuit arrangement for an analog-to-digital conversion process that provides high accuracy and wide bandwidth, that operates with a limited input voltage range, and that can retain the advantages of switched capacitor circuit technology without the need for an offset voltage with a substantial drive current to scale and voltage-shift an input voltage signal.

SUMMARY OF THE INVENTION

Embodiments of the present invention achieve technical advantages by configuring an analog-to-digital converter to produce a digital output signal from an analog input signal, where the analog input signal lies in a range of input signal voltage. The analog-to-digital converter is configured with a programmable-gain amplifier, and a voltage generator coupled to the input of the programmable-gain amplifier, wherein the voltage generator generates an output voltage inversely proportional to the gain of the programmable-gain amplifier. Preferably, the analog-to-digital converter is configured with a switched-capacitor circuit. Preferably, the gain of the programmable-gain amplifier is controlled to be inversely proportional to the range of input signal voltage, and in a preferred embodiment the product of the gain of the programmable-gain amplifier and the output voltage of the voltage generator is 0.5. For high-frequency performance of the downstream elements of the circuit, the programmable-gain amplifier is configured with a two-rail output. In a further preferred embodiment, the gain of the programmable-gain amplifier and the voltage generator are controlled with the same control signal, which is preferably a digital control signal. In a preferred embodiment the voltage generator is configured with a current mirror, and is coupled to a resistor network configured with resistors selectively switched with transistors. To insure accuracy of the analog-to-digital conversion process, the resistors in the resistor network are identically configured and switched with transistors. Preferably, the transistors are MOSFETs. In a preferred embodiment, the MOSFETs are identically configured. Preferably, the analog-to-digital converter is configured as an integrated circuit.

Another embodiment of the present invention is a method of configuring an analog-to-digital converter to produce a digital output signal from an analog input signal, wherein the analog input signal lies within a range of input signal voltage. The method includes configuring the analog-to-digital converter with a programmable-gain amplifier, and coupling a voltage generator to the input of the programmable-gain amplifier. The method further includes generating an output voltage from the voltage generator that is inversely proportional to the gain of the programmable-gain amplifier. Preferably, the method includes configuring the analog-to-digital converter with a switched-capacitor circuit. Preferably, the method includes controlling the gain of the programmable-gain amplifier so that it is inversely proportional to the range of the input signal voltage. Preferably, the method further includes configuring the circuit so that the product of the gain of the programmable-gain amplifier and the output voltage of the voltage generator is 0.5. For high-frequency performance of the downstream elements of the circuit, the method preferably includes configuring the programmable-gain amplifier with a two-rail output. The method preferably includes controlling the gain of the programmable-gain amplifier and the voltage generator with the same control signal. Preferably, the method includes controlling the gain of the programmable-gain amplifier and the voltage generator with a digital control signal. The method further includes configuring the voltage generator with a current mirror, and coupling the current mirror to a network of resistors, and selectively switching the resistors with transistors. To insure accuracy of the analog-to-digital conversion process, the method further preferably includes configuring the resistors in the resistor network identically. Preferably, the method further includes configuring the transistors as MOSFETs. Preferably, the method further includes configuring the MOSFETs identically. The method preferably includes configuring the analog-to-digital converter as an integrated circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely an analog-to-digital converter configured with a programmable-gain amplifier and configured with switched-capacitor circuit technology. An inverse-linear offset voltage generator without the need for substantial drive current capability is coupled to the input of the programmable-gain amplifier.

Figure 1:
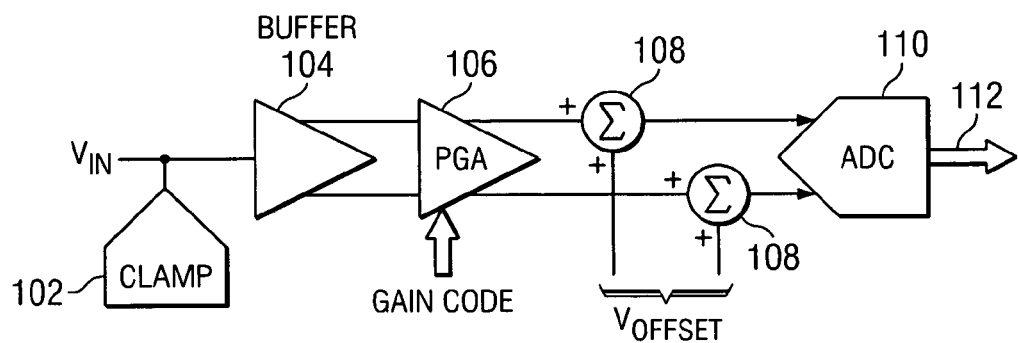
FIG. 1 illustrates a block diagram of an analog-to-digital conversion process of the prior art that scales an input voltage signal and shifts it with a constant offset voltage.
Figure 2:
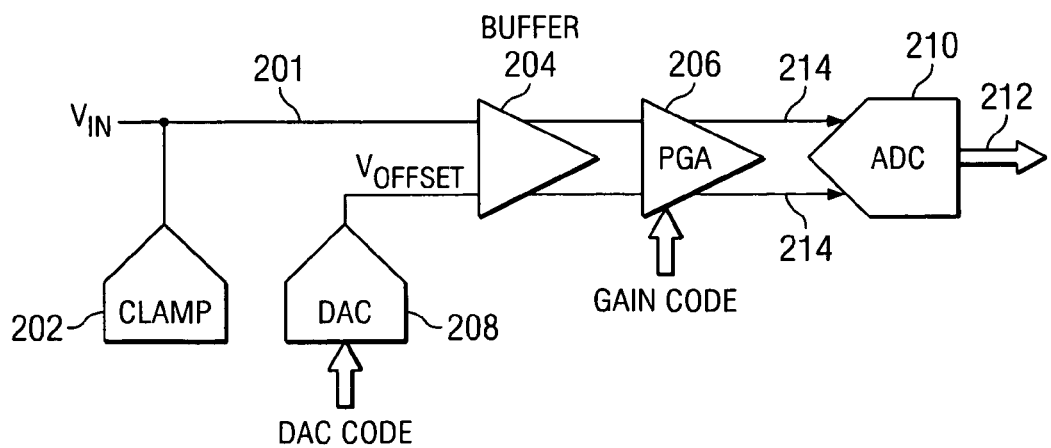
FIG. 2 illustrates a block diagram of an analog-to-digital conversion process of the present invention that shifts an input voltage signal with an inverse-linear circuit and scales it with a programmable-gain amplifier.

Referring to FIG. 2, illustrated is a block diagram of an analog-to-digital conversion process of the present invention showing an input voltage signal VIN coupled to node 201 that is converted to a digital output signal 212, such as a 10-bit digital signal. The voltage of the input voltage signal $V_{IN}$ falls within the range of zero volts to $V_{max}$, where $V_{max}$ is a variable upper voltage limit for the signal VIN. The clamp 202 is included to insure that the input voltage signal $V_{IN}$ does not assume negative voltage values. The block 204 is a buffer configured with a pair of source followers to prevent loading of both the input voltage source 201 and the digital-to-analog converter (DAC), 208. The DAC provides a controllable offset voltage to shift the voltage applied to the programmable-gain amplifier (PGA), 206. The output voltage from the buffer is provided on two rails to the programmable-gain amplifier. The gain of the programmable-gain amplifier is controlled with a binary gain code, such as a 4-bit code. The output of the programmable-gain amplifier is supplied on two rails, 214, to the ADC, 210. The ADC operates on the voltage difference between the two input rails 214, which is constrained in the present example to lie in the range of −0.5 to 0.5 volts.

In the example illustrated in FIG. 2, the ADC provides a 10-bit output signal, and the programmable-gain-amplifier and the DAC are selectively controlled with a 4-bit code. The circuit can be configured as described below so that the programmable-gain amplifier and the DAC are controlled with the same 4-bit code.

To produce an output voltage from the ADC that falls within the range of −0.5 to 0.5 volts, it can be readily shown that the gain of the programmable-gain amplifier must be:

$$G = \frac{1}{V_{max}},$$

and the offset voltage produced by the DAC must be:

$$V_{OFFSET} = \frac{-0.5V}{G},$$

i.e., the input voltage must be shifted negatively and inversely as the gain of the programmable-gain amplifier. The DAC is not required to provide a high-current signal to the buffer in the present circuit arrangement due to the structure of the buffer that is configured with source followers at its input, which exhibits high input impedance. The equations presented above for gain and offset voltage must be executed by the circuit with high accuracy to preserve the quality of the input voltage signal.

If the input voltage is controlled by the upper input voltage limit, $V_{max}$, then:

$$V_{OFFSET} = -0.5 \cdot V_{max},$$

indicating that the offset voltage generator can be controlled by the same 4-bit code as the programmable-gain amplifier because they both depend on the upper input voltage limit $V_{max}$.

The programmable-gain amplifier and the ADC are configured with switched-capacitor circuits that provide accurate amplification gain or voltage conversion by relying on periodic transfer of controlled charge using capacitors that are accurately scaled in area. The capacitors are repetitively switched between input and output portions of the circuit, as is well known in the art, to provide the gain or digital conversion function. The result of using these switched-capacitor circuits is the need for substantial input currents. The input currents are proportional to the charge transferred during each switching cycle times the switching frequency of the switched-capacitor circuit. The input currents are provided by the low output impedance of the source followers in the buffer 204.

Figure 3:
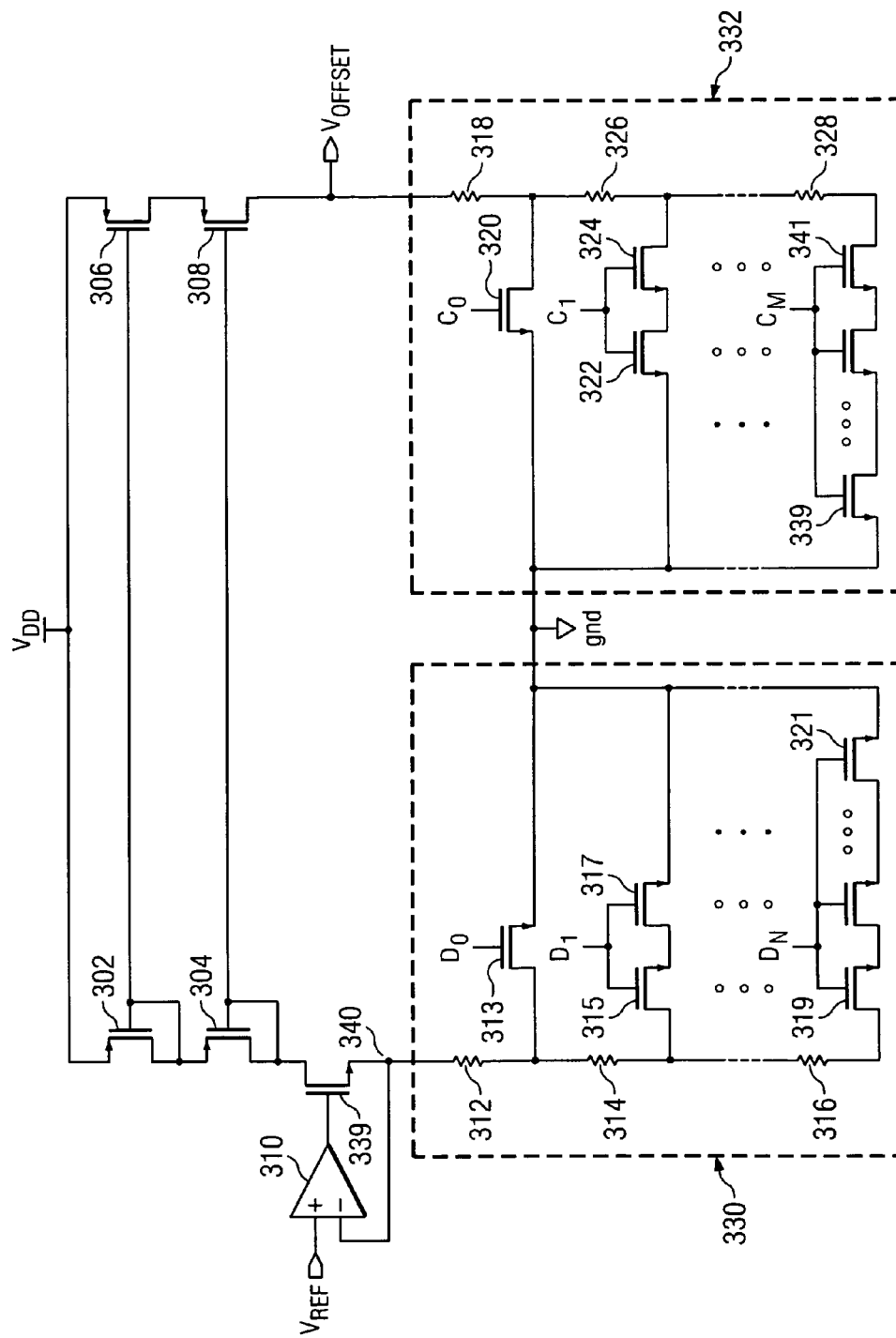
FIGS. 3 and 4 illustrate circuit diagrams of an inverse-linear voltage generator of the present invention.

Turning now to FIG. 3, illustrated is a circuit drawing for a DAC of the present invention to convert a digital signal D=[$D_1$, $D_2$, . . . , DN] to an offset voltage $V_{OFFSET}$ that is inversely scaled to the gain of the programmable-gain amplifier. For a programmable-gain amplifier with gain controlled with a 4-bit binary signal, i.e., with gain that can assume 16 values, the digital control signal D has N=16 digits, and is constrained to assume 16 values such as:

D=0000100000000000, where only one digit in the signal D assumes the value "1", and the "1" is placed in the position corresponding to the numerical value of the 4-bit binary code that controls the gain of the programmable-gain amplifier. For the example of the D illustrated above, the "1" is placed in the fifth digit position, corresponding to the binary code 0101, which has the decimal value 5.

The circuit in FIG. 3 is configured with a cascode arrangement of current mirrors for high current-mirroring accuracy. One current mirror is configured with p-channel MOSFETs 302 and 306, and the second current mirror is configured with p-channel MOSFETs 304 and 308. The sources of MOSFETs 302 and 306 are coupled to a positive bias source $V_{DD}$, supplied from a bias voltage source such as 3.3 volts.

The circuit is configured to control the voltage at the node 340 to be substantially equal to the voltage of the reference voltage $V_{REF}$. The reference voltage $V_{REF}$ is coupled to the non-inverting input of the operational amplifier 310, which includes direct feedback to its inverting input terminal. This feedback controls the output voltage of the operational amplifier, which is coupled to the gate of the n-channel MOSFET 339, so that the voltage at the source terminal of MOSFET 339, which is coupled to circuit node 340, is substantially equal to the voltage of the reference voltage $V_{REF}$. The current flowing through the resistive network 330 to ground is the reference voltage divided by the resistance, R330, of the resistive network 330. This current is accurately mirrored by the cascode-coupled current mirrors to the resistive network 332, which produces a voltage $V_{OFFSET}$ that is the product of the mirrored current and the resistance, R332, of the resistive network 332. Thus, the circuit in FIG. 3 produces an output voltage $V_{OFFSET}$ given by the equation:

$$V_{OFFSET} = V_{REF} \cdot \frac{R332}{R330},$$

illustrating that the output voltage $V_{OFFSET}$ is proportional to the resistance R332 and inversely proportional to the resistance R330.

To provide high accuracy in producing the output voltage $V_{OFFSET}$, the selected ratio of the resistances of the resistance networks 330 and 332 must be accurately controlled. Recognizing that transistor and resistor resistances vary substantially from lot to lot, and vary also with operating temperature, the resistor networks must be configured with substantially identical components to preserve resistance ratios. Thus, each of the resistances 312, 314, 316, etc., in resistance network 330 are configured identically and are also configured identically to resistances 318, 326, 328, etc., in resistance network 332. If one resistance path in network 330 is selected, i.e., resistor 312, then one MOSFET, 313, is turned on. If two resistors in network 330 are selected, i.e., resistors 312 and 314, the two MOSFETs, 315 and 317, are turned on. When maximum resistance is required, then resistors 312, 314, . . . , and 316 and MOSFETs 319, . . . , 321, are turned on. MOSFETs 313, 315, . . . , 321 are identically configured to insure the precision of the digital-to-analog conversion process.

Similar control is used for the resistance network 332. If one resistance path in network 332 is selected, i.e., resistor 318, then one MOSFET, 320, is turned on. If two resistors in network 332 are selected, i.e., resistors 320 and 326, then two MOSFETs, 322 and 324, are turned on. When maximum resistance is required, then resistors 318, 326, . . . , and 328 and MOSFETs 339, . . . , 341, are utilized. MOSFETs 320, 322, . . . , and 341 similarly are identically configured.

In this manner the ratio of resistances of the networks 330 and 332 can be preserved with high accuracy. It is recognized that a series arrangement of multiple MOSFETs such as MOSFETs 315 and 317 can be configured in an alternative embodiment as a single MOSFET with appropriately scaled length-to-width ratio for the single device. This alternative is a preferred embodiment of the invention as contemplated within the scope of the claims.

Figure 4:
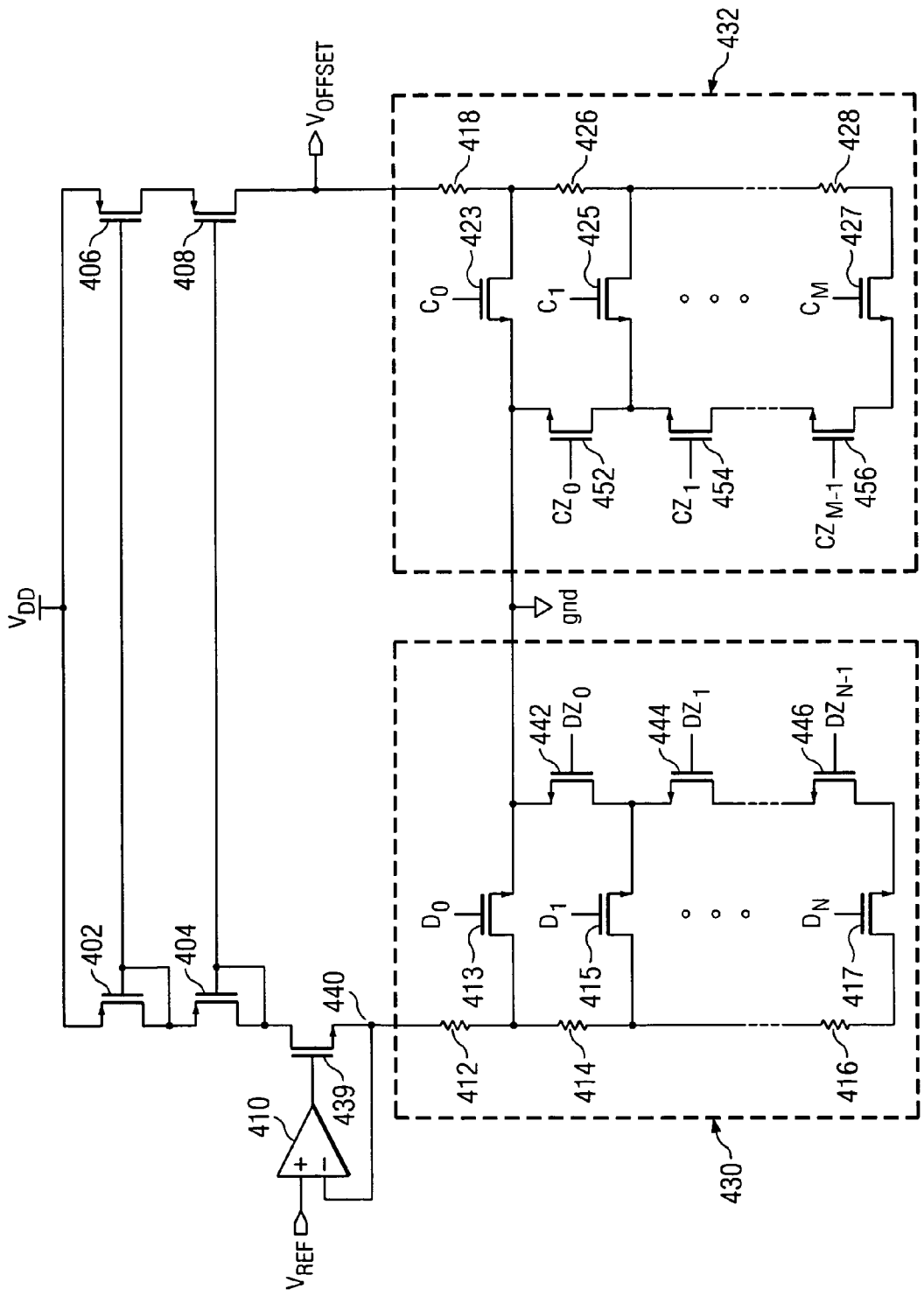

Turning now to FIG. 4, illustrated is a circuit drawing for another configuration of a DAC of the present invention with reduced die area corresponding to the circuit in FIG. 3 to convert the digital signal D=[$D_1$, $D_2$, ..., $D_N$] to an offset voltage $V_{OFFSET}$ that is inversely scaled to the gain of the programmable-gain amplifier. The programmable-gain amplifier is again assumed to be controlled with a 4-bit binary signal, i.e., a binary signal that can assume 16 values as previously described.

The circuit in FIG. 4 is also configured with a cascode arrangement of current mirrors for high current-mirroring accuracy. One current mirror is configured with p-channel MOSFETs 402 and 406, and the second current mirror is configured with p-channel MOSFETs 404 and 408. The sources of MOSFETs 402 and 406, similar to the circuit illustrated in FIG. 3, are coupled to a positive bias source $V_{DD}$, operating from a bias voltage source such as 3.3 volts.

The circuit in FIG. 4 is configured to control the voltage at the node 440 to be substantially equal to the voltage of the reference voltage $V_{REF}$ using the operational amplifier 410 and the n-channel MOSFET 439. The current flowing through the resistive network 430 to ground is the reference voltage divided by the resistance of the resistive network 430. This current is accurately mirrored by the cascode-coupled current mirrors to the resistive network 432, which produces a voltage $V_{OFFSET}$ that is the product of the mirrored current and the resistance of the resistive network 432. Thus, the circuit in FIG. 4 also produces an output voltage $V_{OFFSET}$ that is proportional to the resistance of the network 432, and inversely proportional to the resistance of the network 430.

To provide high accuracy in producing the output voltage $V_{OFFSET}$, the selected ratio of the resistances of the resistance networks 430 and 432 must also be accurately controlled, again using resistor networks configured with substantially identical components to preserve resistance ratios based on device areas. Thus, each of the resistances 412, 414, 416, etc., in resistance network 430 are configured identically, and are also configured identically to resistances 418, 426, and 428, etc., in resistance network 432. If one resistance path in network 430 is selected, i.e., resistor 412, then one MOSFET, 413, is turned on. If two resistors in network 430 are selected, i.e., resistors 412 and 414, then two MOSFETs, 415 and 442, are turned on. When maximum resistance is required, then resistors 412, 414, ..., and 416 and MOSFETs 417, 442, ..., 446, are turned on. MOSFETs 417, 442, ..., 446 are identically configured. MOSFETs 413, ..., 417 are controlled with the signal D as described hereinabove. MOSFETs 442, ..., 446 are controlled with the signal DZ which is derived from the signal D as follows: The signal DZ has one fewer digit than the signal D, and the "1s" are filled progressively to the right with appearance much like a "thermometer." For example, if D=1000000000000000, then DZ=000000000000000. If D=0100000000000000, then DZ=100000000000000. If D=0000100000000000, then DZ=111100000000000, etc.

For network 432, MOSFETs 423, 425, ..., 427 and 452, 454, ..., 456 are similarly controlled by the digital signals C and CZ. The signal CZ is related to the signal C as the signal DZ is related to the signal D.

An important consideration in the design of either the circuit illustrated in FIG. 3 or the circuit illustrated in FIG. 4 is management of the MOSFET channel-modulation effect. If the MOSFET areas and geometries are scaled so that substantial voltage is sustained between drains and sources when MOSFETs are turned on, then the on resistances increase due to the channel-modulation effect. The current through a MOSFET channel operating in the triode/linear region is given by the equation:

$$I = \mu \cdot C_{ox} \cdot \left(\frac{W}{L}\right)[(V_{GS} - V_{TH}) \cdot V_{DS} - 0.5 \cdot V_{DS}^2],$$

where $\mu$ is channel carrier mobility, $C_{ox}$ is gate oxide capacitance per unit area, W/L is the gMOSFET channel width-to-length ratio, $V_{GS}$ is the MOSFET gate-to-source voltage, and $V_{TH}$ is the MOSFET threshold voltage, typically about 0.7 volts. Thus, to insure that sufficient current is conducted by each MOSFET with sufficiently low voltage drop when it is turned on, it is necessary to scale the devices for the expected currents so that the drain-to-source voltages are sufficiently low.

From analysis well known in the art, it can be shown that to make the output voltage error from the circuit less than 1 mV, which corresponds to 10-bit conversion accuracy, when the gate-to-source voltage exceeds the MOSFET gate threshold voltage by about 2 V, the drain-to-source voltage should be less than about 60 mV. The 60 mV drain-to-source voltage limit is a guideline for a 10-bit conversion process operating from a bias voltage source of about 3.3 volts.

The areas required for the MOSFETs in the circuit in FIG. 3 can be compared with the areas required for the MOSFETs in the circuit in FIG. 4. For the circuit in FIG. 3, a total of N·(N−1)/2 substantially identical transistors are required. For the circuit in FIG. 4, a total of only 2·N substantially identical transistors are required. Thus, a saving in circuit area can be realized using the circuit in FIG. 4. If the circuit illustrated in FIG. 3 is configured using single but properly scaled MOSFETs in place of the series arrangement of identical MOSFETs shown in FIG. 3, the area saving using the circuit in FIG. 4 relative to the circuit in FIG. 3 is roughly the same.

Figure 5A:
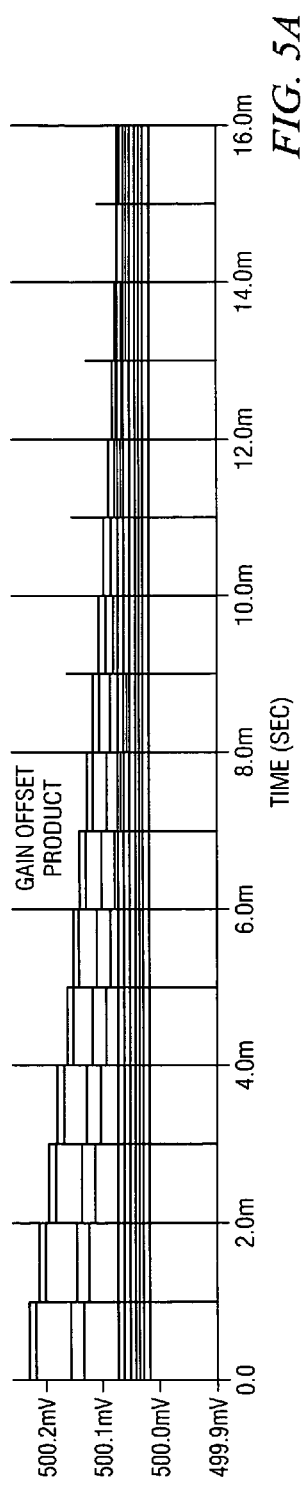
FIGS. 5A, 5B and 5C show the results of simulation of the analog-to-digital conversion process illustrated in FIG. 2 with manufacturing process variations.
Figure 5B:
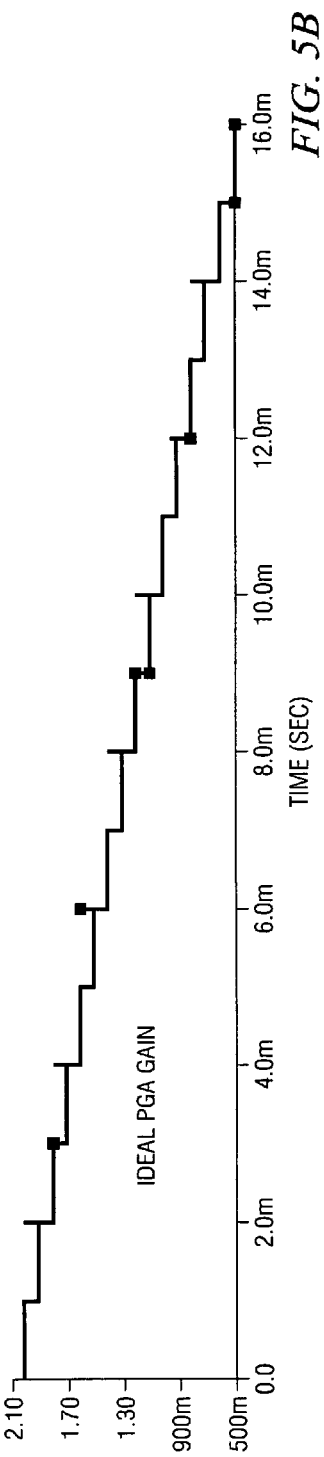
Figure 5C:
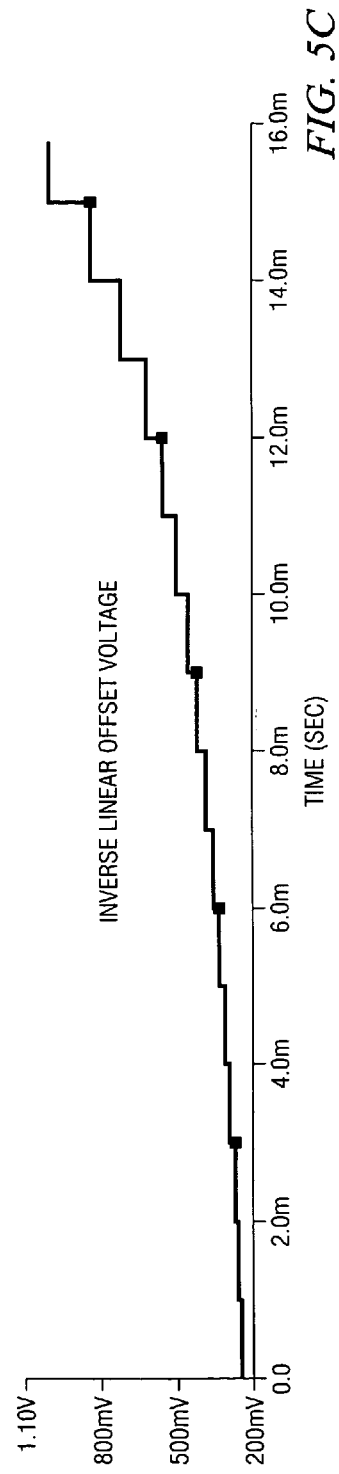

Turning now to FIGS. 5A, 5B and 5C, illustrated on a common time axis are the results of simulating a switched-capacitor circuit with a programmable-gain amplifier controlled by a four-bit digital code, such as the circuit shown in FIG. 2. The simulation was run for 16 cases representing limits of a practical manufacturing process.

In the simulation, the digital gain-control code was incremented to control the programmable-gain amplifier gain from 2.0 to 0.5 in gain steps of 0.1. The inverse-linear offset voltage, which ideally should be stepped from 0.25 to 1.0 volt with inverse-linear steps, was controlled in the same manner. The simulation incremented the controlled amplifier gain at 1 ms time points over a 16 ms period, producing the 16 exemplary cases.

Demonstrated in FIG. 5C, the ideal inverse-linear offset voltage is plotted. In FIG. 5B, the ideal gain of the programmable-gain amplifier is shown. In FIG. 5A; the product of the simulated offset voltage and the simulated gain of the programmable-gain amplifier is shown for the 16 cases, where the ideal product is 0.500 for all cases. This graph demonstrates that the circuit of the present invention, producing an inverse-linear offset voltage relying on area and geometry of circuit elements for accuracy, is essentially insensitive to variations in a practical manufacturing process. The gain-offset voltage product indicates errors that are less than 0.05%, which exceed the accuracy of a 10-bit digital-to-analog converter, i.e. 0.1%.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing reduced drive currents from a voltage source as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An analog-to-digital converter configured to produce a digital output signal from an analog input signal, comprising:
   an amplifier with a programmable gain; and
   a voltage generator coupled to an input of the amplifier, wherein the voltage generator generates an output voltage inversely proportional to the gain of the programmable-gain amplifier by current-mirrored switched resistor networks.

2. The analog-to-digital converter according to claim 1, wherein the analog-to-digital converter is configured with a switched-capacitor circuit.

3. The analog-to-digital converter according to claim 1, wherein the gain of the programmable-gain amplifier is controlled to be inversely proportional to the range of input signal voltage.

4. The analog-to-digital converter according to claim 1, wherein the programmable-gain amplifier is configured with a two-rail output.

5. The analog-to-digital converter according to claim 1, wherein the gain of the programmable-gain amplifier and the voltage generator are controlled with the same control signal.

6. The analog-to-digital converter according to claim 5, wherein the control signal is a digital control signal.

7. The analog-to-digital converter according to claim 6, wherein the digital control signal is a 4-bit digital control signal.

8. The analog-to-digital converter according to claim 1, wherein the voltage generator is configured with a current mirror.

9. The analog-to-digital converter according to claim 1, wherein the analog-to-digital converter is configured as an integrated circuit.

10. A method of producing a digital output signal from an analog input signal from an analog-to-digital converter, comprising:
    configuring an amplifier with a programmable gain;
    coupling a voltage generator to an input of the amplifier; and
    configuring the voltage generator to generate an output voltage that is inversely proportional to the gain of the programmable-gain amplifier by use of current-mirrored switched resistor networks.

11. The method according to claim 10, including configuring the analog-to-digital converter with a switched-capacitor circuit.

12. The method according to claim 10, including controlling the gain of the programmable-gain amplifier to be inversely proportional to the range of input signal voltage.

13. The method according to claim 10, including controlling the gain of the programmable-gain amplifier and the voltage generator with the same control signal.

14. An analog-to-digital converter to produce a digital output signal from an analog input signal, comprising:
    means for configuring an amplifier with a programmable gain; and
    means for generating an output voltage inversely proportional to the gain of the programmable-gain amplifier with current-mirrored switched resistor networks, and coupling the means for generating to an input of the amplifier.

15. The analog-to-digital converter according to claim 14, wherein the means for configuring further comprises means for configuring the analog-to-digital converter with a switched-capacitor circuit.

* * * * *